(12) United States Patent
Roberts, Jr. et al.

(10) Patent No.: US 9,181,809 B2
(45) Date of Patent: Nov. 10, 2015

(54) COATED ARTICLE

(71) Applicant: General Electric Company, Schenectady, NY (US)

(72) Inventors: Frederic Woodrow Roberts, Jr., Simpsonville, SC (US); Michael John Brown, Columbia, SC (US); James Stewart Phillips, Easley, SC (US)

(73) Assignee: General Electric Company, Schenectady, NY (US)

( * ) Notice: Subject to any disclaimer, the term of this patent is extended or adjusted under 35 U.S.C. 154(b) by 743 days.

(21) Appl. No.: 13/693,269

(22) Filed: Dec. 4, 2012

(65) Prior Publication Data

US 2014/0150455 A1    Jun. 5, 2014

(51) Int. Cl.

| B05D 1/32 | (2006.01) |
| F01D 5/28 | (2006.01) |
| F01D 25/12 | (2006.01) |
| B05B 15/04 | (2006.01) |
| C23C 14/04 | (2006.01) |
| F01D 5/18 | (2006.01) |

(52) U.S. Cl.
CPC ............ *F01D 5/288* (2013.01); *B05B 15/0462* (2013.01); *B05D 1/32* (2013.01); *C23C 14/042* (2013.01); *F01D 5/186* (2013.01); *F01D 25/12* (2013.01); *F05D 2230/90* (2013.01); *F05D 2240/128* (2013.01); *F05D 2260/202* (2013.01); *F05D 2260/231* (2013.01); *Y02T 50/672* (2013.01); *Y02T 50/676* (2013.01)

(58) Field of Classification Search
CPC ........... F01D 5/186; F01D 5/288; F01D 9/02; F01D 25/12; F05D 2230/90; F05D 2240/128; F05D 2240/15; F05D 2260/231; F05D 2260/202; C23C 14/042; C23C 16/04; B05D 1/31; B05B 15/0462

See application file for complete search history.

(56) References Cited

U.S. PATENT DOCUMENTS

| 5,565,035 | A | 10/1996 | Sylvestro et al. |
| 5,902,647 | A | 5/1999 | Venkataramani et al. |
| 5,985,122 | A | 11/1999 | Conner |
| 6,234,755 | B1 | 5/2001 | Bunker et al. |
| 6,258,226 | B1 | 7/2001 | Conner |
| 6,667,076 | B2 * | 12/2003 | Fried et al. .................... 427/448 |
| 7,553,534 | B2 | 6/2009 | Bunker |
| 7,772,314 | B2 * | 8/2010 | Fernihough et al. .......... 524/492 |
| 7,939,135 | B2 | 5/2011 | Toppen et al. |
| 2011/0116912 | A1 | 5/2011 | McCall et al. |
| 2011/0293836 | A1 | 12/2011 | Ohara |
| 2012/0076644 | A1 | 3/2012 | Zuniga et al. |
| 2013/0045106 | A1 * | 2/2013 | Lacy ............................ 416/237 |

FOREIGN PATENT DOCUMENTS

EP         2439377 A2 *    4/2012

* cited by examiner

*Primary Examiner* — Ninh H Nguyen
(74) *Attorney, Agent, or Firm* — Robert M. Orenstein; Ernest G. Cusick; Frank A. Landgraff

(57) ABSTRACT

The present invention is a coated article containing at least two adjacent cooling holes that are substantially uncoated. In an embodiment, the coated article includes a base material, an outer surface and a coating on a portion of the outer surface. Here, the adjacent cooling holes are arranged along an axis on the outer surface and extend within the base material at an angle to the outer surface. The coating may include at least one unfinished edge oriented substantially parallel to the axis and set off at an oblique angle and a distance from the adjacent cooling holes.

6 Claims, 6 Drawing Sheets

US 9,181,809 B2

COATED ARTICLE

BACKGROUND OF THE INVENTION

The present invention relates generally to a coated article; and, more particularly, to a coated gas turbine component containing at least two adjacent cooling holes that are substantially uncoated.

In a gas turbine, pressurized air is mixed with fuel and ignited to generate hot pressurized gases. The hot pressurized gases pass through successive turbine stages that convert the thermal and kinetic energy from the hot pressurized gases to mechanical torque acting on a rotating shaft or other element, thereby producing power used for both compressing the incoming air and driving an external load, such as an electric generator. As used herein, the term "gas turbine" may encompass stationary or mobile turbomachines, and may have any suitable arrangement that causes rotation of one or more shafts.

The components exposed to the hot pressurized gases are typically hollow or contain a plurality of internal passages through which a pressurized fluid, such as compressed air, is caused to flow for the purpose of cooling the components. The cooling fluid typically exits to the flow of hot pressurized gases through a plurality of holes disposed within the component base material.

It is often advantageous to coat portions of the components with a coating to insulate the base material from the hot pressurized gases and protect the base material from environmental degradation. The coating may include one or more intermediate layers of metal and one or more outer layers of ceramic, which may be deposited to a final thickness of at least 0.13 mm (0.005 inches). It is therefore desirable that each of the cooling holes provided in the base material be protected during the application of the coating to avoid filling the holes or changing the shape of the hole exit regions.

BRIEF DESCRIPTION OF THE INVENTION

Embodiments of the present invention are summarized below. These embodiments are not intended to limit the scope of the claimed invention, but rather, these embodiments are intended only to provide a brief summary of possible forms of the invention. Furthermore, the invention may encompass a variety of forms that may be similar to or different from the embodiments set forth below, commensurate with the scope of the claims.

According to a first embodiment of the present invention, a gas turbine system includes at least one compressor, at least one combustor, at least one rotating turbine stage, and at least one stationary turbine stage; wherein the at least one stationary turbine stage includes at least one turbine nozzle having a base material, an outer surface and a coating on a portion of the outer surface; wherein at least two adjacent cooling holes are arranged along an axis on the outer surface and extend within the base material at an angle to the outer surface, and the coating includes at least one unfinished edge oriented substantially parallel to the axis and set off at an oblique angle and a distance from the at least two adjacent cooling holes.

According to a second embodiment of the present invention, a coated gas turbine component includes a base material, an outer surface and a coating on a portion of the outer surface; wherein at least two adjacent cooling holes are arranged along an axis on the outer surface and extend within the base material at an angle to the outer surface, and the coating includes at least one unfinished edge oriented substantially parallel to the axis and set off at an oblique angle and a distance from the at least two adjacent cooling holes.

According to a third embodiment of the present invention, a coated gas turbine component includes a base material, an outer surface and a coating on a portion of the outer surface; wherein at least two adjacent cooling holes are arranged along an axis on the outer surface and extend within the base material at an angle to the outer surface, and the coating includes at least one unfinished edge oriented substantially parallel to the axis and set off at an oblique angle and a distance from the at least two adjacent cooling holes; which is obtainable by preparing one or more mask elements substantially conforming to the contours of the outer surface and having at least one edge oriented substantially parallel to the axis, wherein the at least one edge protrudes from the outer surface at substantially the oblique angle and extends substantially the distance from the at least two adjacent cooling holes, and a central portion oriented substantially parallel to the axis and raised with respect to the at least one edge, wherein the one or more mask elements substantially cover the at least two adjacent cooling holes; affixing the one or more mask elements to the outer surface; coating the outer surface; and removing the one or more mask elements from the outer surface.

According to a fourth embodiment of the present invention, a method for preparing a coated gas turbine component includes the steps of preparing one or more mask elements substantially conforming to the contours of the outer surface of the component and having at least one edge oriented substantially parallel to an axis along which at least two adjacent cooling holes are arranged, wherein the at least one edge protrudes from the outer surface at an oblique angle and extends a distance from the at least two adjacent cooling holes, and a central portion oriented substantially parallel to the axis and raised with respect to the at least one edge, wherein the one or more mask elements substantially cover the at least two adjacent cooling holes; affixing the one or more mask elements to the outer surface; coating the outer surface; and removing the one or more mask elements from the outer surface.

BRIEF DESCRIPTION OF THE DRAWINGS

These and other features, aspects and advantages of the present invention may become better understood when the following detailed description is read with reference to the accompanying figures (FIGS), wherein like reference numerals refer to like parts throughout the various views unless otherwise specified.

DETAILED DESCRIPTION OF THE INVENTION

Specific embodiments of the present invention are described below. This written description, when read with reference to the accompanying figures, provides sufficient detail to enable a person having ordinary skill in the art to practice the invention, including making and using any devices or systems and performing any incorporated methods. However, in an effort to provide a concise description of these embodiments, every feature of an actual implementation may not be described in the specification, and embodiments of the present invention may be employed in combination or embodied in alternate forms and should not be construed as limited to only the embodiments set forth herein. The scope of the invention is, therefore, indicated and limited only by the claims, and may include other embodiments that may occur to those skilled in the art.

The terminology used herein is for describing particular embodiments only and is not intended to be limiting of example embodiments. As used herein, an element or step recited in the singular and proceeded with the word "a" or "an" should be understood as not excluding plural elements or steps, unless such exclusion is explicitly recited. Furthermore, references to "one embodiment" of the present invention are not intended to be interpreted as excluding the existence of additional embodiments that also incorporate the recited features.

Similarly, the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof. As used herein, the term "and/or" includes any, and all, combinations of one or more of the associated listed items.

Certain terminology may be used herein for the convenience of the reader only and is not to be taken as a limitation on the scope of the invention. For example, words such as "upper", "lower", "left", "right", "front", "rear", "top", "bottom", "horizontal", "vertical", "upstream", "downstream", "fore", "aft", and the like, when used without further limitation, merely describe the specific configuration illustrated in the various views. Similarly, the terms "first", "second", "primary", "secondary", and the like, when used without further limitation, are only used to distinguish one element from another and do not limit the elements described.

Figure 1:
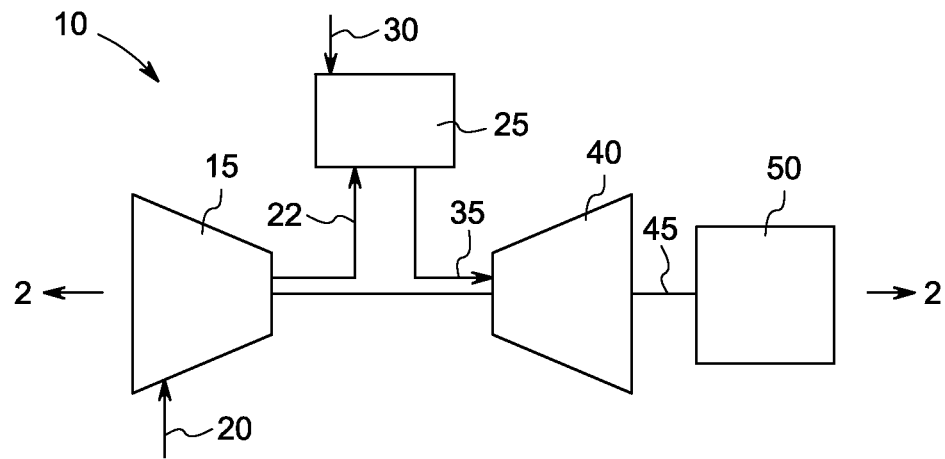
FIG. 1 is a schematic illustration of an exemplary gas turbine system in which embodiments of the present invention may operate.

Referring now to the figures (FIGS), wherein like reference numerals refer to like parts throughout the various views unless otherwise specified, FIG. 1 illustrates an exemplary gas turbine system 10 in which embodiments of the present invention may operate. The gas turbine system 10 includes a compressor 15 that compresses an incoming flow of air 20. The compressed flow of air 22 is delivered to at least one combustor 25, in which the air is mixed with fuel 30 and ignited, producing a flow of hot pressurized gases 35. The flow of hot pressurized gases 35 is delivered to a turbine 40, in which the gases pass through one or more stationary and rotating turbine stages that convert the thermal and kinetic energy from the hot pressurized gases to mechanical torque acting on one or more rotating elements connected to a rotating shaft 45. An external load 50, such as a generator, is connected to the shaft 45, thereby converting the mechanical torque to electricity. The shaft 45 may also extend forward through the turbine 40 to drive the compressor 15, or a separate shaft (not illustrated) may be provided from the turbine 40 for that purpose.

Figure 2:
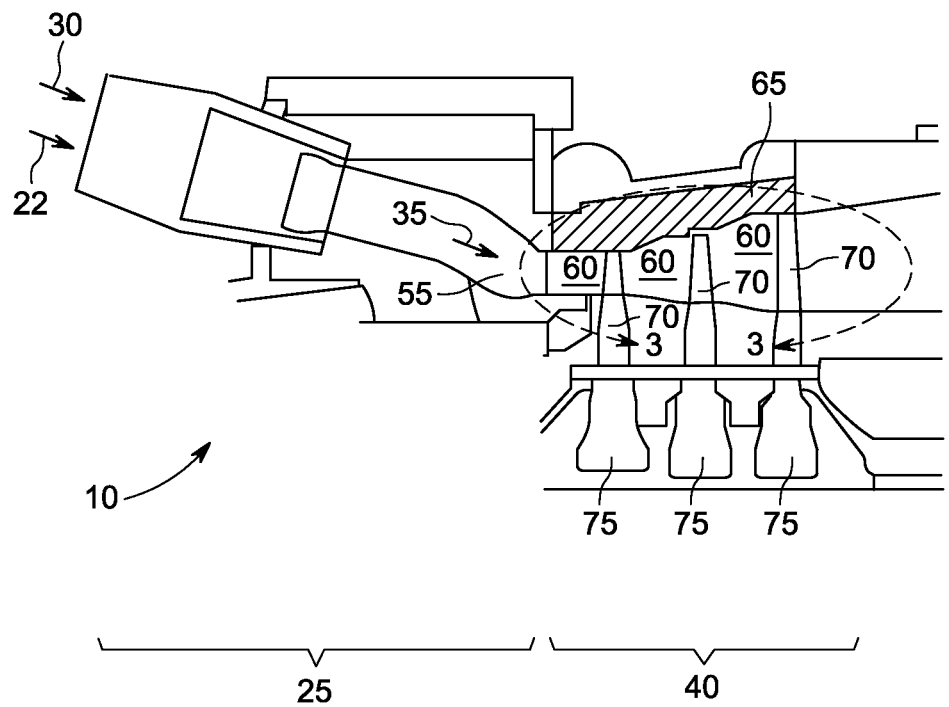
FIG. 2 is a partial cross-sectional view of the gas turbine system of FIG. 1 viewed along the along the line 2-2.

FIG. 2 is a partial cross-sectional view of the gas turbine system 10 viewed along the line 2-2. The hot pressurized gases 35 exit the combustor 25 through a transition piece 55, which directs the gases 35 into the turbine 40 through a stationary turbine stage 60 that is disposed within an annular casing 65. The hot pressurized gases 35 are directed by the stationary turbine stage 60 into a rotating turbine stage 70, including a rotating disk 75, which is connected to the rotating shaft 45 (FIG. 1). The hot pressurized gases 35 may be further directed to additional stationary and rotating turbine stages (60, 70, 75). Although the turbine 40 is illustrated as including three stages, the components and assemblies described herein may be employed in any suitable type of turbine having any suitable number and arrangement of stages, disks and shafts.

Figure 3:
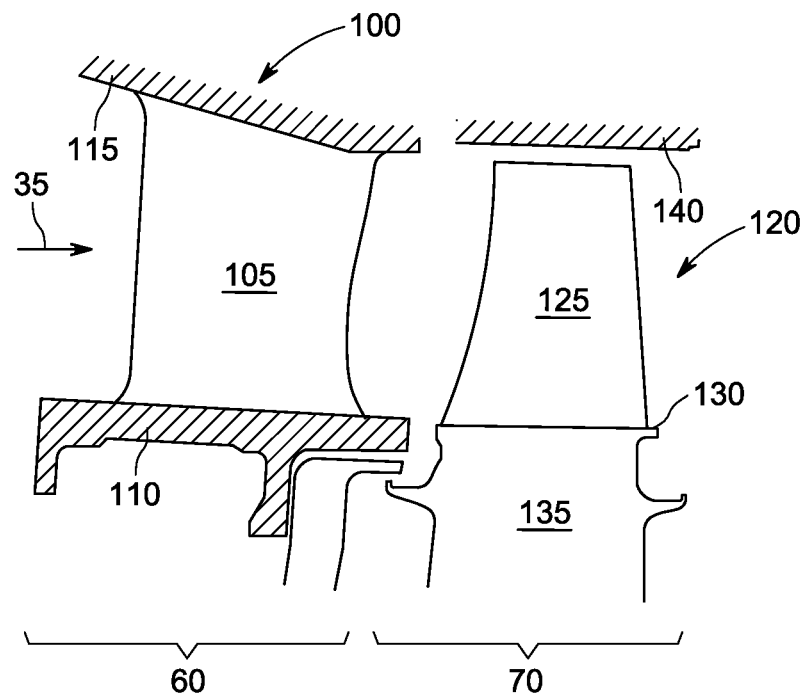
FIG. 3 is an expanded view of the turbine of FIG. 2 taken within the line 3-3.

FIG. 3 is an expanded view of the turbine of FIG. 2 taken within the line 3-3, illustrating the first stationary turbine stage 60 and the first rotating turbine stage 70. The hot pressurized gases 35 enter the stationary turbine stage 60 in the direction indicated by the arrow. The stationary turbine stage 60 includes a plurality of circumferentially adjacent nozzles 100 that are radially disposed within the annular casing 65 (FIG. 2). Each nozzle includes an airfoil 105, a radially inner endwall 110 and a radially outer endwall 115 that contain and direct the flow of hot pressurized gases 35 to the rotating turbine stage 70.

The rotating turbine stage 70 includes a plurality of circumferentially adjacent buckets 120 that are connected to and radially disposed about the rotating disk 75 (FIG. 2). Each bucket includes an airfoil 125, a platform 130 and a shank 135. An annular shroud 140 may be disposed at the radially outer end of the airfoil 125, and operates with the airfoil 125 and platform 130 to contain and direct the flow of hot pressurized gases 35 to successive turbine stages.

Figure 4:
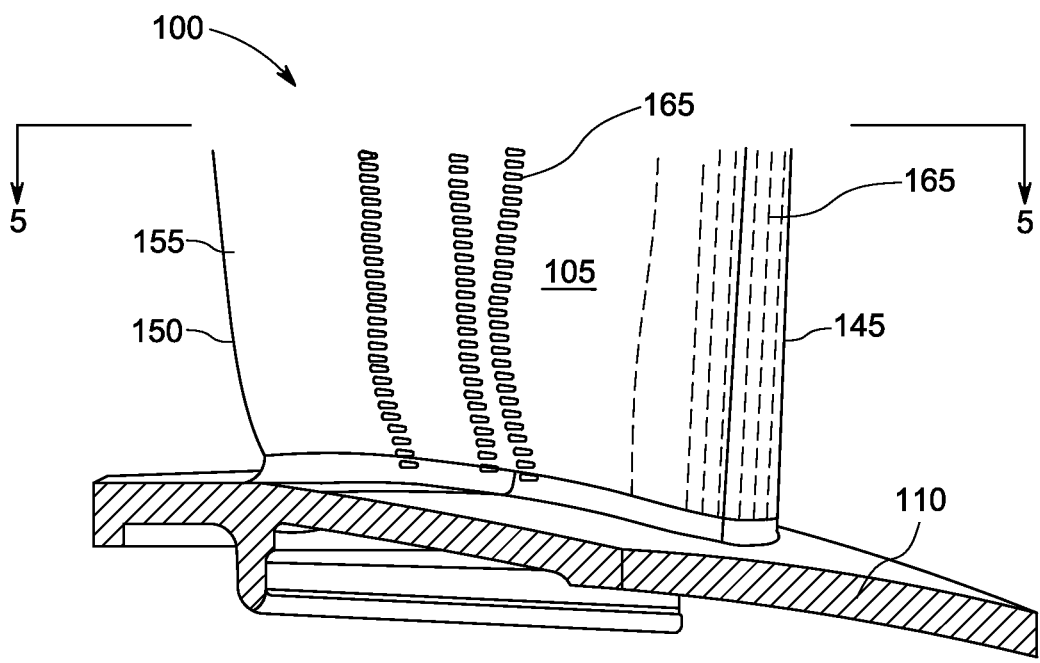
FIG. 4 is a partial perspective view of the nozzle of FIG. 3 in accordance with aspects of the present invention.

FIG. 4 illustrates a partial perspective view of the gas turbine nozzle 100 of FIG. 3 in accordance with aspects of the present invention. The airfoil 105 includes a leading edge 145, a trailing edge 150, a concave side 155 and a convex side 160 (not shown). Two different arrangements of airfoil cooling holes 165 are illustrated. However, the skilled practitioner will appreciate that any number of cooling holes may be placed in any location and in any pattern on the airfoil 105, and may be similarly included on the other components illustrated in FIG. 3 (e.g. inner nozzle endwall 110, outer nozzle endwall 115, bucket airfoil 125, bucket platform 130, and annular shroud 140) in accordance with aspects of the present invention.

Figure 5:
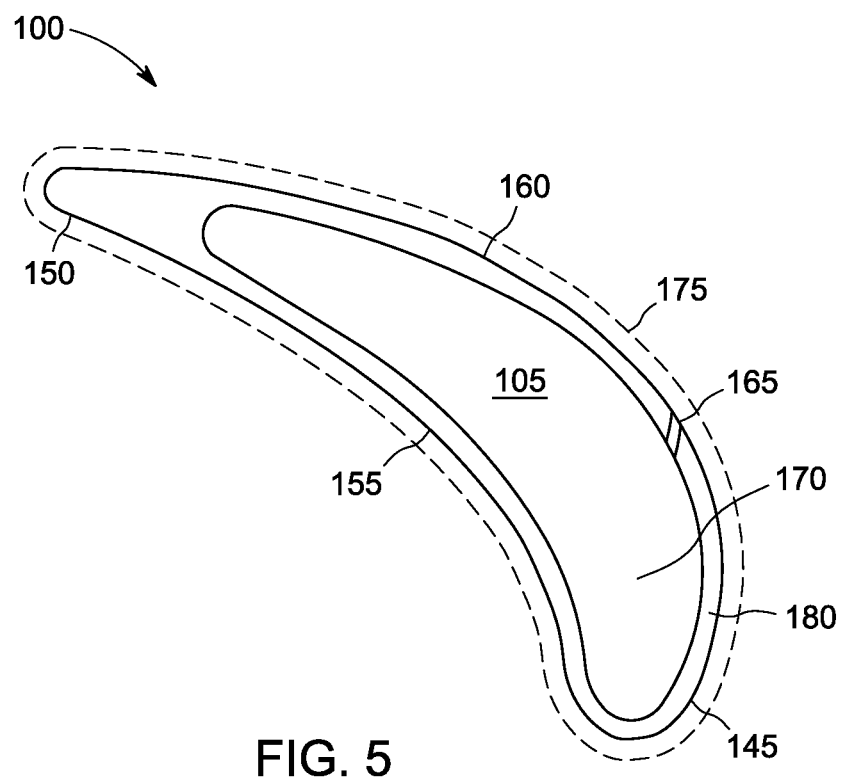
FIG. 5 is a cross-sectional view of the nozzle airfoil of FIG. 4 viewed along the line 5-5.

FIG. 5 illustrates a cross-sectional view of the nozzle airfoil 105 of FIG. 4 viewed along the line 5-5. In operation, a flow of cooling fluid (typically compressed air or an inert gas such as nitrogen) is provided to an internal cavity 170 in the airfoil 105. The internal cavity 170 is in fluid connection with the outer surfaces (e.g. leading edge 145, trailing edge 150, concave side 155, convex side 160) of the airfoil 105 through one or more cooling holes 165. For simplicity, only a single cooling hole is illustrated, but the skilled practitioner will appreciate that any number of cooling holes may be placed in any location and in any pattern on the component surface; and may be of any suitable shape, dimension, spacing, and orientation; in accordance with aspects of the present invention.

FIG. 5 also illustrates a coating 175 on the outer surfaces of the airfoil 105 that serves to insulate the base material 180 from the hot pressurized gases and protect the base material from environmental degradation. The coating may include one or more intermediate layers of metal and one or more outer layers of ceramic, which may be deposited to a final thickness of at least 0.13 mm (0.005 inches). A typical coating may include an intermediate layer of metal such as NiCrAlY that is deposited using a thermal spray process such as Air Plasma Spray (APS), Vacuum Plasma Spray (VPS), or High Velocity Oxy-Fuel (HVOF); and an outer layer of ceramic such as Yttria-Stabilized Zirconia (YSZ) that is deposited using an APS process. However, the skilled practitioner will appreciate that the foregoing materials and processes are included as examples, and that any suitable coating deposited using any suitable process may be included in accordance with aspects of the present invention.

The coating may be applied in a single operation or in successive steps, such that successively deposited layers are built up to achieve the desired thickness and may adhere to each other and the base material by metallurgical, chemical or physical means. The skilled practitioner will also appreciate that the final coating thickness may be varied on different regions of the airfoil 105, and may be similarly included on the other components illustrated in FIG. 3 (e.g. inner nozzle endwall 110, outer nozzle endwall 115, bucket airfoil 125, bucket platform 130, and annular shroud 140) in accordance with aspects of the present invention.

Figure 6:
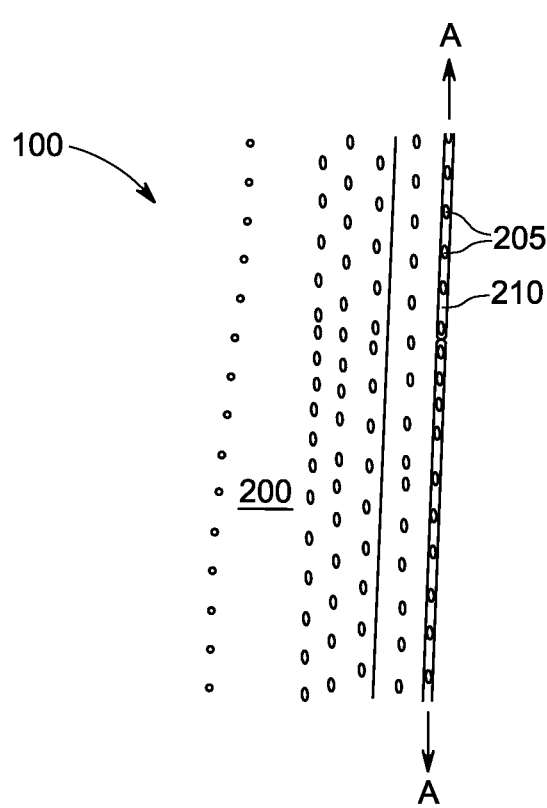
FIG. 6 is an expanded perspective view of the gas turbine nozzle of FIG. 4 in accordance with aspects of the present invention.

FIG. 6 illustrates an expanded perspective view of the gas turbine nozzle 100 of FIG. 4 in accordance with aspects of the present invention. The outer surface 200 of the nozzle contains at least two adjacent cooling holes 205 arranged in a row that is substantially along an axis A-A. Each of the adjacent cooling holes extends into the base material in a direction that is substantially parallel to the axis A-A (not illustrated). One or more mask elements 210 are provided to shield the adjacent cooling holes during application of a coating (not illustrated). The dimensions of the mask elements are normally chosen such that the portion of outer surface 200 between the adjacent cooling holes 205 and oriented substantially along the axis A-A is shielded, and the portions of the outer surface 200 extending away from the adjacent cooling holes 205 are unshielded. However, the dimensions suggested are not intended to be limiting, and any suitable dimensions of the mask elements may be chosen in accordance with aspects of the present invention. For example, the mask elements may shield a plurality of the adjacent cooling holes 205 arranged in a single row, and may also shield a plurality of similarly oriented rows of the adjacent cooling holes 205.

The mask elements 210 may be formed from any suitable material capable of withstanding the temperatures present during the coating process, which typically exceed 1315 degrees Celsius (2400 degrees Fahrenheit). Considerations in the selection of a suitable material are cost, formability, dimensional stability, and structural integrity; particularly if the mask elements are to be reused during the coating of several nozzles in a manufacturing process. Exemplary materials are aluminum, carbon steel, stainless steel, Inconel®, carbon composite, aluminum oxide, silicon nitride, and ceramic composite. The mask elements may be fabricated using any suitable method such that they substantially conform to the contours of the outer surface 200, including, but not limited to, metal forming processes such as machining, forging, casting, and hydroforming The mask elements may also be coated with a material that reduces friction between the mask element material and the coating, which aids in removal of the mask element following application of the coating. Exemplary materials are graphite, polytetrafluoroethylene or PTFE, and molybdenum disulfide ($MoS_2$). It should be understood that the foregoing examples are not intended to be limiting, and that other candidate materials and forming methods may be suitable for producing the mask elements in accordance with aspects of the present invention.

The mask elements 210 may be affixed to the component using any suitable method; such as pins, tabs or other appendages, or joining methods such as tack welding. Considerations in the selection of a suitable method for affixing the mask elements include the nozzle geometry and material, mask element geometry and material, time required for affixing and removing the mask elements, and other process considerations.

Figure 7:
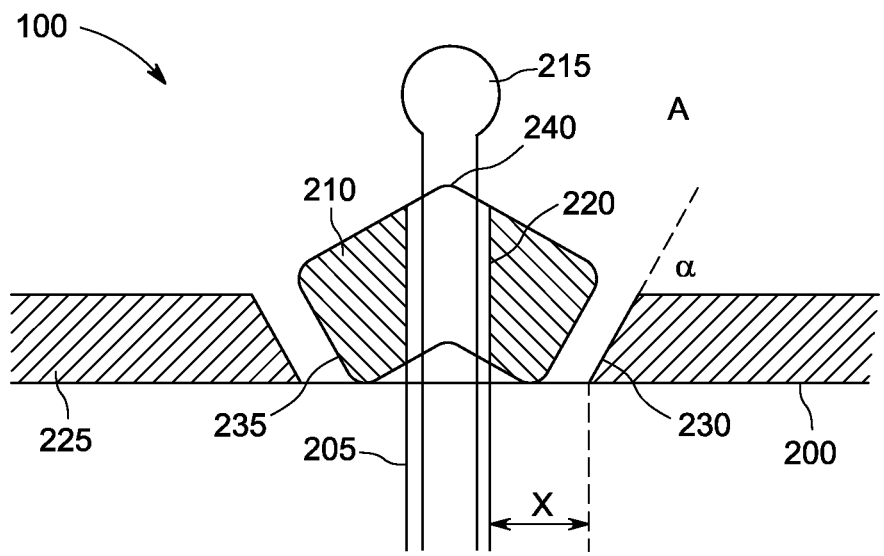
FIG. 7 is an expanded cross-sectional view of the gas turbine nozzle of FIG. 6 viewed along a direction substantially normal to the axis A-A.

FIG. 7 illustrates an expanded cross-sectional view of the gas turbine nozzle 100 of FIG. 6 viewed along a direction substantially normal to the axis A-A. At least one pin 215 is inserted through at least one hole 220 in the mask element 210 and into at least one of the adjacent cooling holes 205. The pin 215 may be formed from any suitable material and using any suitable method, such as those described in the discussion of the mask element above. Exemplary materials are aluminum, carbon steel, stainless steel, Inconel®, carbon composite, aluminum oxide, silicon nitride, and ceramic composite. The pin may also be coated with a material that reduces friction between the pin material and the coating, such as those described above. It should be understood that the foregoing examples are not intended to be limiting, and that other suitable means for affixing the mask elements to the component may be used in accordance with aspects of the present invention.

FIG. 7 also illustrates the coating 225 in the fully deposited condition, but prior to any surface finishing steps; such as sanding, grinding, drilling, or polishing. The coating 225 includes at least one unfinished edge 230 oriented substantially parallel to the axis A-A and set off at an oblique angle α and a distance x from the adjacent cooling holes 205. In an embodiment, the oblique angle α is less than about 90 degrees to the portion of the outer surface 200 extending away from the adjacent cooling holes 205. In another embodiment, the oblique angle α is from about 20 to about 160 degrees to the portion of the outer surface 200 extending away from the adjacent cooling holes 205. In yet another embodiment, the distance x is up to about 4 times the average diameter of the adjacent cooling holes 205.

FIG. 7 further illustrates the mask element 210 viewed in cross-section along the direction substantially normal to the axis A-A. The mask element 210 includes at least one edge 235 oriented substantially parallel to the axis A-A and protruding from the outer surface 200 at an oblique angle α and extending a distance x from the adjacent cooling holes 205 (substantially corresponding to the orientation and location of the unfinished edge 230 of the coating). The surface 240 of the central portion of the mask element 210 is oriented substantially parallel to the axis A-A and raised with respect to the edge 235. In an embodiment, the oblique angle α is less than about 90 degrees to the portion of the outer surface 200 extending away from the adjacent cooling holes 205. In another embodiment, the oblique angle α is from about 20 to about 160 degrees to the portion of the outer surface 200 extending away from the adjacent cooling holes 205. In yet another embodiment, the distance x is up to about 4 times the average diameter of the adjacent cooling holes 205.

Figure 8:
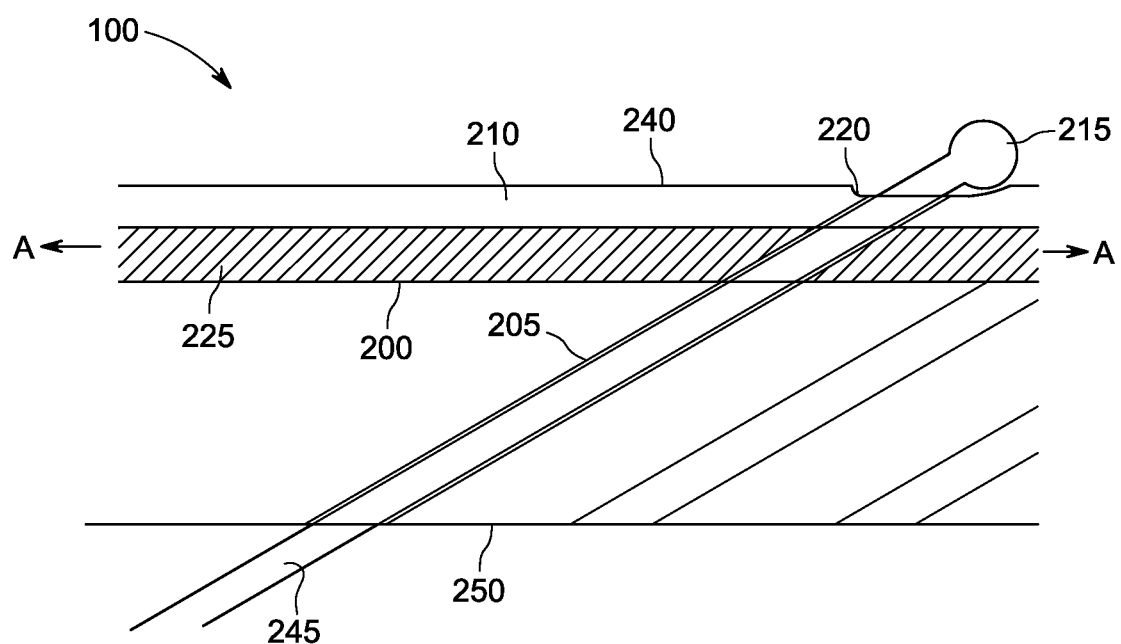
FIG. 8 is an expanded cross-sectional view of the gas turbine nozzle of FIG. 6 viewed along the axis A-A.
Figure 9:
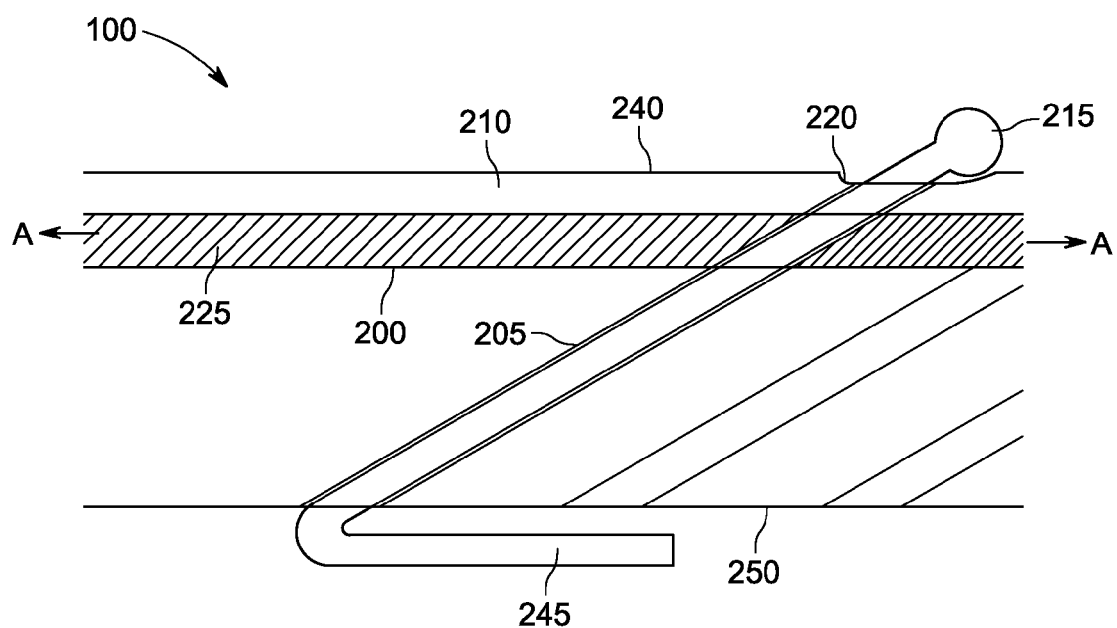
FIG. 9 is an expanded cross-sectional view of the gas turbine nozzle of FIG. 6 viewed along the axis A-A.

FIGS. 8 and 9 illustrate an expanded cross-sectional view of the gas turbine nozzle 100 of FIG. 6 viewed along the axis A-A, and further illustrate the arrangement for affixing the mask element 210 to the gas turbine nozzle 100 using at least one pin 215 when the adjacent cooling holes 205 extend within the base material in a direction that is substantially parallel to the axis A-A. The pin 215 is substantially straight prior to the assembly process. The mask element 210 is located on the outer surface 200 such that at least one hole 220 in the mask element is in registration with at least one of the adjacent cooling holes 205. The pin 215 is next inserted through the hole 220 and into the corresponding adjacent cooling hole 205, as illustrated in FIG. 8. The end 245 of the pin 215 that protrudes from the inner surface 250 may be bent, as illustrated in FIG. 9, in order to lock the pin in place.

Figure 10:
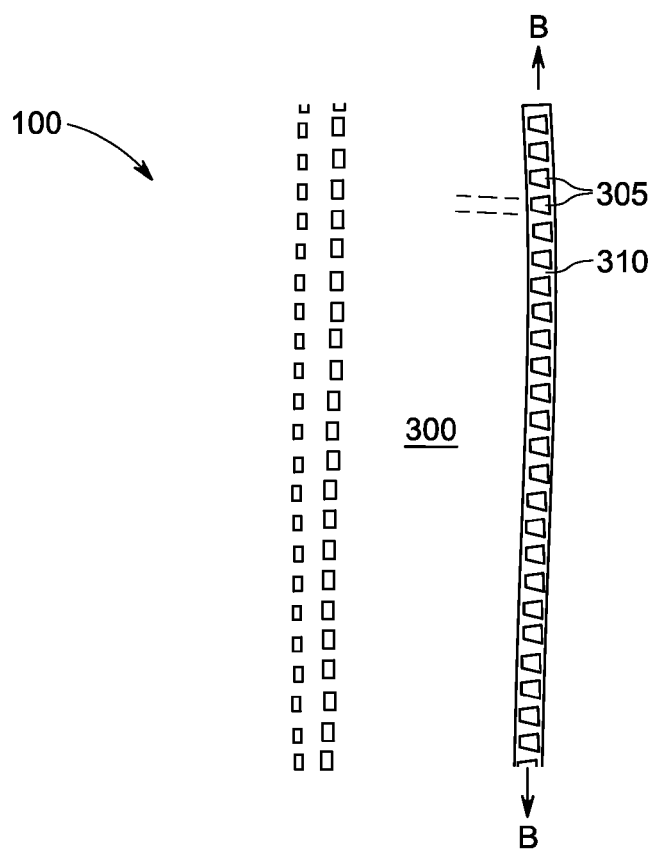
FIG. 10 is an expanded perspective view of the gas turbine nozzle of FIG. 4 in accordance with aspects of the present invention.

FIG. 10 illustrates an expanded perspective view of the gas turbine nozzle 100 of FIG. 4 in accordance with aspects of the present invention. The outer surface 300 of the nozzle contains at least two adjacent cooling holes 305 arranged in a row that is substantially along an axis B-B. Each of the adjacent cooling holes extends into the base material in a direction that is not substantially parallel to the axis B-B, as illustrated by the dashed lines. One or more mask elements 310 are provided to shield the adjacent cooling holes during application of a coating (not illustrated). The dimensions of the mask elements are normally chosen such that the portion of outer surface 300 between the adjacent cooling holes 305 and oriented substantially along the axis B-B is shielded, and the portions of the outer surface 300 extending away from the adjacent cooling holes 305 are unshielded. However, the dimensions suggested are not intended to be limiting, and any suitable dimensions of the mask elements may be chosen in accordance with aspects of the present invention. For example, the mask elements may shield a plurality of the adjacent cooling holes 305 arranged in a single row, and may also shield a plurality of similarly oriented rows of the adjacent cooling holes 305.

The mask elements 310 may be formed from any suitable material and method, as described previously. Similarly, the mask elements 310 may be affixed to the component using any suitable method, as described previously.

Figure 11:
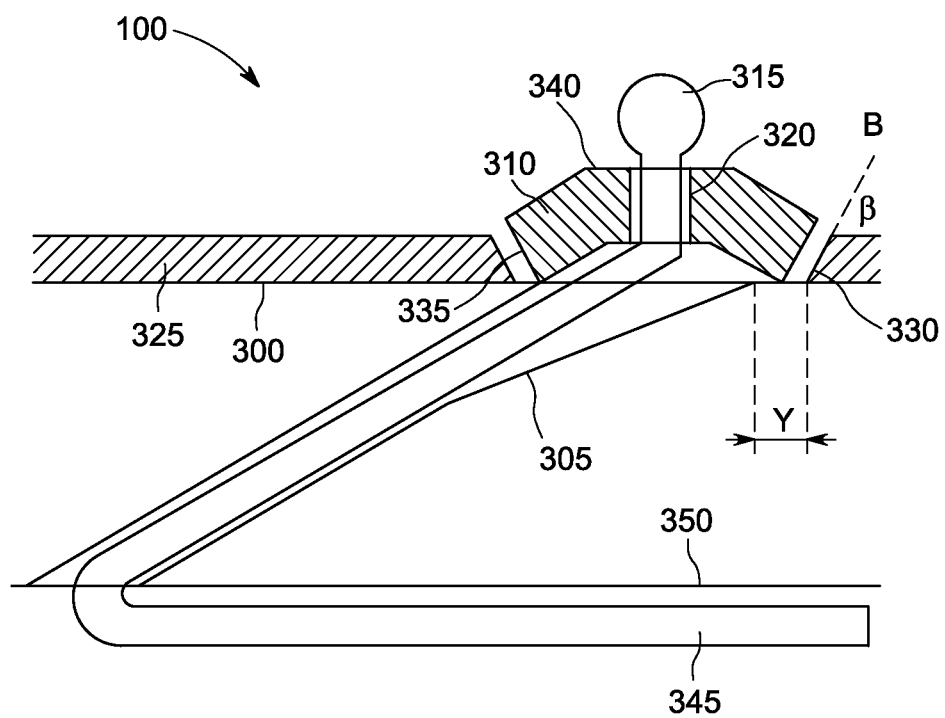
FIG. 11 is an expanded cross-sectional view of the gas turbine nozzle of FIG. 10 viewed along a direction substantially normal to the axis B-B.

FIG. 11 illustrates an expanded cross-sectional view of the gas turbine nozzle 100 of FIG. 10 viewed along a direction substantially normal to the axis B-B. At least one pin 315 is inserted through at least one hole 320 in the mask element 310 and into at least one of the adjacent cooling holes 305. The pin 315 may be formed from any suitable material and using any suitable method, as described previously.

FIG. 11 also illustrates the coating 325 in the fully deposited condition, but prior to any surface finishing steps; such as sanding, grinding, drilling, or polishing. The coating 325 includes at least one unfinished edge 330 oriented substantially parallel to the axis B-B and set off at an oblique angle β and a distance y from the adjacent cooling holes 305. In an embodiment, the oblique angle β is less than about 90 degrees to the portion of the outer surface 300 extending away from the adjacent cooling holes 305. In another embodiment, the oblique angle β is from about 20 to about 160 degrees to the portion of the outer surface 300 extending away from the adjacent cooling holes 305. In yet another embodiment, the distance y is up to about 4 times the average diameter of the adjacent cooling holes 305.

FIG. 11 further illustrates the mask element 310 viewed in cross-section along the direction substantially normal to the axis B-B. The mask element 310 includes at least one edge 335 oriented substantially parallel to the axis B-B and protruding from the outer surface 300 at an oblique angle β and extending a distance y from the adjacent cooling holes 305 (substantially corresponding to the orientation and location of the unfinished edge 330 of the coating). The surface 340 of the central portion of the mask element 310 is oriented substantially parallel to the axis A-A and raised with respect to the edge 335. In an embodiment, the oblique angle β is less than about 90 degrees to the portion of the outer surface 300 extending away from the adjacent cooling holes 305. In another embodiment, the oblique angle β is from about 20 to about 160 degrees to the portion of the outer surface 300 extending away from the adjacent cooling holes 305. In yet another embodiment, the distance y is up to about 4 times the average diameter of the adjacent cooling holes 305.

FIG. 11 further illustrates the arrangement for affixing the mask element 310 to the gas turbine nozzle 100 using at least one pin 315 when the adjacent cooling holes 305 extend within the base material in a direction that is not substantially parallel to the axis B-B. The mask element 310 is located on the outer surface 300 such that at least one hole 320 in the mask element is in registration with at least one of the adjacent cooling holes 305. The pin 315 is next inserted through the hole 320 and into the corresponding adjacent cooling hole 305. The end 345 of the pin 315 that protrudes from the inner surface 350 may be bent in order to lock the pin in place.

As described above, the present invention contemplates a coated gas turbine component containing at least two adjacent cooling holes that are substantially uncoated. The cooling holes are arranged along an axis on the coated surface and extend within the base material, and the coating may include at least one unfinished edge oriented substantially parallel to the axis and set off at an oblique angle and a distance from the cooling holes.

Although specific embodiments are illustrated and described herein, including the best mode, those of ordinary skill in the art will appreciate that all additions, deletions and modifications to the embodiments as disclosed herein and which fall within the meaning and scope of the claims may be substituted for the specific embodiments shown. Similarly, other embodiments of the invention may be devised which do not depart from the spirit or scope of the present invention. Such other embodiments are intended to be within the scope of the claims if they have structural elements that do not differ from the literal language of the claims, or if they include equivalent structural elements with insubstantial differences from the literal languages of the claims. Likewise, the system components illustrated are not limited to the specific embodiments described herein, but rather, system components can be utilized independently and separately from other components described herein. For example, the components and assemblies described herein may be employed in any suitable type of gas turbine, aircraft engine, or other turbomachine having any suitable number and arrangement of stages, disks and shafts while still falling within the meaning and scope of the claims.

What is claimed is:

1. A method for preparing a coated gas turbine component comprising the steps of:
   preparing one or more mask elements substantially conforming to the contours of an outer surface of the component and comprising:
      at least one edge oriented substantially parallel to an axis along which at least two adjacent cooling holes are arranged, wherein the at least one edge protrudes from the outer surface at an oblique angle and extends a distance from the at least two adjacent cooling holes, and
      a central portion oriented substantially parallel to the axis and raised with respect to the at least one edge, wherein the one or more mask elements substantially cover the at least two adjacent cooling holes;

affixing the one or more mask elements to the outer surface;

coating the outer surface; and removing the one or more mask elements from the outer surface.

2. The method of claim 1, wherein the oblique angle is less than about 90 degrees relative to the portion of the outer surface extending away from the at least two adjacent cooling holes.

3. The method of claim 1, wherein the oblique angle is from about 20 to about 160 degrees relative to the portion of the outer surface extending away from the at least two adjacent cooling holes.

4. The method of claim 1, wherein the distance is up to about 4 times the average diameter of the at least two adjacent cooling holes.

5. The method of claim 1, wherein the step of affixing the one or more mask elements to the outer surface comprises inserting at least one pin through the one or more mask elements.

6. The method of claim 5, wherein the step of affixing the one or more mask elements to the outer surface comprises inserting the at least one pin into at least one of the at least two adjacent cooling holes.

\* \* \* \* \*